(12) United States Patent
Dean

(10) Patent No.: US 7,078,263 B2
(45) Date of Patent: Jul. 18, 2006

(54) METHOD AND APPARATUS FOR HERMETIC SEALING OF ASSEMBLED DIE

(75) Inventor: William Kit Dean, Golden, CO (US)

(73) Assignee: Optical Communications Products, Inc., Woodland Hiils, CA (US)

( * ) Notice: Subject to any disclaimer, the term of this patent is extended or adjusted under 35 U.S.C. 154(b) by 85 days.

(21) Appl. No.: 10/990,890

(22) Filed: Nov. 17, 2004

(65) Prior Publication Data

US 2005/0094951 A1     May 5, 2005

Related U.S. Application Data

(62) Division of application No. 10/387,290, filed on Mar. 12, 2003, now Pat. No. 6,879,038.

(51) Int. Cl.
*H01L 21/44* (2006.01)
(52) U.S. Cl. .......................... 438/106; 385/14; 385/31; 385/33
(58) Field of Classification Search ................. 385/14, 385/31, 33, 34, 92, 94
See application file for complete search history.

(56) References Cited

U.S. PATENT DOCUMENTS

| | | | |
|---|---|---|---|
| 3,796,930 A | 3/1974 | Page .................. 317/235 R |
| 4,389,481 A | 6/1983 | Poleshuk et al. ........... 430/319 |
| 5,656,526 A | 8/1997 | Inada et al. ................. 430/314 |
| 5,760,479 A | 6/1998 | Yang et al. ................. 257/778 |
| 5,818,110 A | 10/1998 | Cronin ........................ 257/775 |
| 5,888,850 A | 3/1999 | Havens et al. .............. 438/127 |
| 5,888,884 A | 3/1999 | Wojnarowski .............. 438/462 |
| 6,002,163 A | 12/1999 | Wojnarowski .............. 257/620 |
| 6,054,376 A | 4/2000 | Balakrishnan .............. 438/612 |
| 6,156,651 A | 12/2000 | Havemann ................... 438/674 |
| 6,245,665 B1 | 6/2001 | Yokoyama .................. 438/623 |
| 6,863,450 B1 * | 3/2005 | Mazotti et al. ............... 385/92 |
| 2004/0179411 A1 | 9/2004 | Dean .......................... 365/200 |

FOREIGN PATENT DOCUMENTS

JP          11-307827          11/1999

* cited by examiner

*Primary Examiner*—Mai-Huong Tran
(74) *Attorney, Agent, or Firm*—Barlow, Josephs & Holmes, Ltd.

(57) ABSTRACT

An optically transparent, hermetic coating is locally formed on die and other components already assembled in an existing nonhermetic structure. The local hermetic sealing of an OSA includes providing an OSA having at least one exposed optoelectronic component, and providing a paralene source. The method provides for positioning a mask between the paralene source and the OSA, the mask including an opening aligned with a first region of the OSA. The first region includes at least one of the exposed optoelectronic components. The paralene source is then caused to generate paralene such that a permanent paralene coating is deposited through the opening and on the first region of the OSA. The permanent paralene coating essentially hermetically seals the first region. The permanent paralene coating is chosen to be transparent to the wavelength of light emitted and/or used in the optical sub-assembly.

12 Claims, 6 Drawing Sheets

METHOD AND APPARATUS FOR HERMETIC SEALING OF ASSEMBLED DIE

A DIV of Ser. No. 10/387,290 Mar. 12, 2003 U.S. Pat. No. 6,879,038

BACKGROUND OF THE INVENTION

In most applications it is advantageous to hermetically seal many or all of the electronic die and other optical components that combine to form an OSA (optical subassembly) or other assembled or partially assembled optical communications module. Conventional hermetic sealing of electronic die and other optoelectronic components requires extensive mechanical design and considerable tooling and materials fabrication to provide an ancillary support structure that creates an essentially gas-tight enclosure. Such techniques may include the use of bulk metal housings and macroscopic sheets used as glass covers. The use of such conventional techniques for the hermetic sealing of components used in optical communications, is contrary to the miniaturization desirably afforded to such components sized for optical wavelengths.

Optical communications modules may represent the medium-scale integration of individual semiconductor die and other optoelectronic components, each comprising a different function. Hermeticity of the overall enclosure is desirable when the hermeticity of the individual components cannot be provided. Hermeticity of the overall package is required for reliable operation of the modules in adverse or non-benign environments.

Conventional methods for hermetically sealing individual die upon formation are available but such hermeticity does not extend beyond the individual die in the subassembly or module. As above, techniques for the hermetic sealing of assembled or partially assembled electronic components are also available, but such methods typically require undesirable ancillary, macroscopic support structures such as bulk housings and glass covers. It is therefore desirable to provide a method and structure for hermetically sealing a portion of an OSA or another optical communication module that includes multiple electronic components, to provide hermeticity without the use of the additional macroscopic bulk supports conventionally used in the art.

SUMMARY OF THE INVENTION

The present invention provides a method and structure for providing localized hermeticity on an OSA or other optical communication module, without the construction of additional support members. An optically transparent, hermetic coating may be locally formed on die and other components already assembled in an existing nonhermetic structure.

In one embodiment, the present invention provides for the local hermetic sealing of an OSA according to a method that includes providing an OSA having at least one exposed optoelectronic component, and providing a paralene source.

The method provides for positioning a mask between the paralene source and the OSA, the mask including an opening-aligned with a first region of the OSA. The first region includes at least one of the exposed optoelectronic components. The paralene source is then caused to generate paralene such that a permanent paralene coating is deposited through the opening and on the first region of the OSA. The permanent paralene coating essentially hermetically seals the first region. According to one exemplary embodiment, the permanent paralene coating is chosen to be transparent to the wavelength of light emitted and/or used in the optical sub-assembly.

In another exemplary embodiment, the present invention provides an optical subassembly that includes a localized hermetic coating formed directly on a first region, the first region including at least a VCSEL (vertical cavity surface emitting laser), a photodetector, or an integrated circuit die. The localized hermetic coating does not extend outside the first region, which it hermetically seals.

BRIEF DESCRIPTION OF THE DRAWINGS

The present invention is best understood from the following detailed description when read in conjunction with the accompanying drawings. It is emphasized that, according to common practice, the various features of the figures are not to-scale. On the contrary, the dimensions of the various features are arbitrarily expanded or reduced for clarity. Included are the following figures.

DETAILED DESCRIPTION OF THE INVENTION

The present invention provides a method and apparatus for applying a coating of a dielectric material such as paralene, through deposition or sputtering, that provides local sealing of a selected region within an OSA or other optical communication module. In one embodiment, the region may be formed on a surface of a ceramic carrier that is part of an OSA. The region may include an individual hermetic or non-hermetic semiconductor die or a group of such die therewithin. Various other optoelectronic components may be included in the locally hermetically sealed region. The coating can be applied through a stencil or opening formed in a mechanical mask or sabot which is aligned over the components formed in the region. According to an exemplary embodiment in which the regions are surfaces of ceramic carriers, a plurality of the ceramic carriers may be joined to a metal carrier prior to coating, and therefore the mask may include a corresponding plurality of openings to provide a local coating to each of the multiple ceramic carriers, in a single deposition operation. The coating may advantageously hermetically seal the area on which it is formed.

Figure 1:
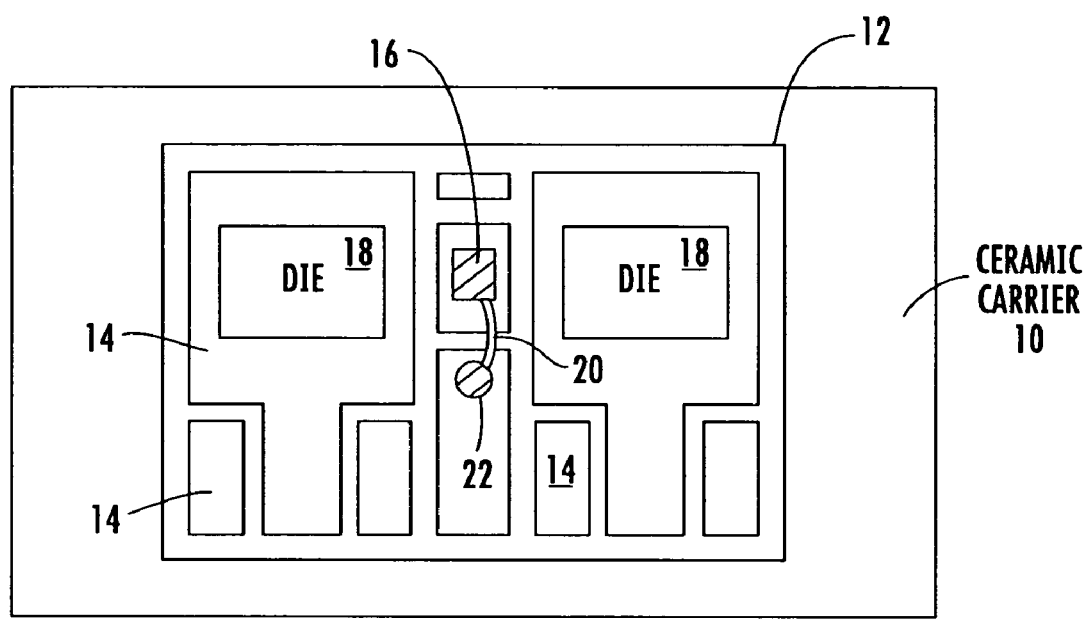
FIG. 1 is a plan view showing optoelectronic components disposed in a cavity of an exemplary ceramic carrier.

FIG. 1 is a plan view of an exemplary OSA. FIG. 1 shows an exemplary ceramic carrier 10 which includes portion 12. Portion 12 may be a cavity formed in ceramic carrier 10 in one exemplary embodiment. Within portion 12 are a number of ceramic surfaces 14. Also within portion 12 and formed on ceramic surfaces 14, are a number of optoelectronic components. The optoelectronic components are exposed such that a coating may be formed on them. The optoelectronic components include a duality of die 18 in the illustrated embodiment. Die 18 may be any of various integrated circuit, IC, or other semiconductor devices. The illustrated embodiment also includes optoelectronic structure 16 which may be a VCSEL (vertical cavity surface emitting laser) or photodetector wire bonded by means of wire bond 20 to bond pad 22. The optoelectronic components shown in portion 12 are intended to be exemplary only and according to other exemplary embodiments, portion 12 may take on different shapes, and may include various other and/or additional optoelectronic components disposed on the exposed surface of portion 12. The optoelectronic components may already be bonded to metalization within carrier 10. Portion 12 may be a cavity formed within carriers formed of non-ceramic materials such as metals and semiconductors, in other embodiments. In other words, ceramic carrier 10 is exemplary and the carrier may be formed of other materials. According to still another exemplary embodiment, portion 12 and the optoelectronic components may be formed on a surface of the carrier, and not within a cavity formed in the carrier. The individual components such as die 18 may be individually hermetically sealed or they may be non-hermetic.

Figure 2:
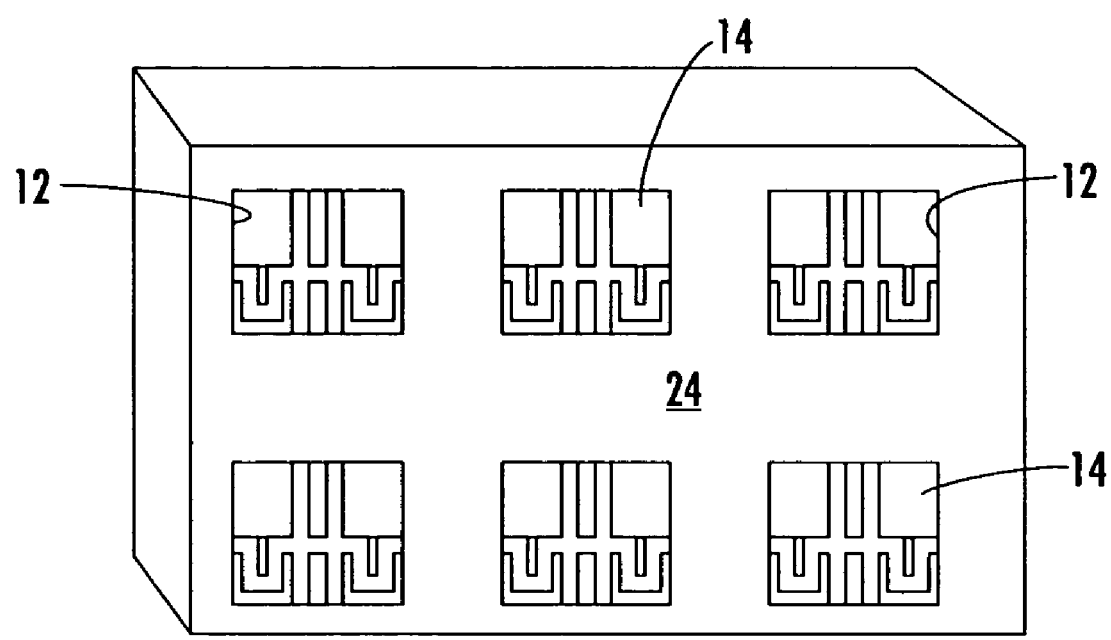
FIG. 2 shows ceramic carriers on a common metal carrier during assembly.

FIG. 2 is a perspective view showing an array of portions 12 assembled in a common metal carrier 24. The portions 12 are designated and targeted to have an opening in a mask aligned thereover, in order to form a coating in portion 12, that takes on the shape of the mask opening aligned over portion 12. The exemplary arrangement of a 2×3 array of targeted portions 12 is intended to be exemplary only and various other numbers and arrangements of targeted portions may be arranged in various configurations on a metal carrier during assembly. Although not illustrated, it is understood that each portion 12 will desirably include the exemplary arrangement of optoelectronic components therein, such as illustrated previously in FIG. 1. Each portion 12 may be a cavity formed in a corresponding carrier (not shown), or portion 12 may represent the surface of a corresponding carrier (not shown), that is disposed in or on the metal carrier 24. Metal carrier 24 is intended to be exemplary only and various other carriers used during assembly which are formed of materials other than metal, may be used in other exemplary embodiments. Metal carrier 24 may be used to facilitate the assembly of various components such as shown in FIG. 1, onto the surfaces 14 of targeted portion 12 shown in FIGS. 1 and 2. Various other operations may advantageously be performed simultaneously or individually to the multiple ceramic or other carriers included on metal carrier 24. Automatic machinery may be used to place portions 12 and their corresponding carriers, on metal carrier 24.

Figure 3:
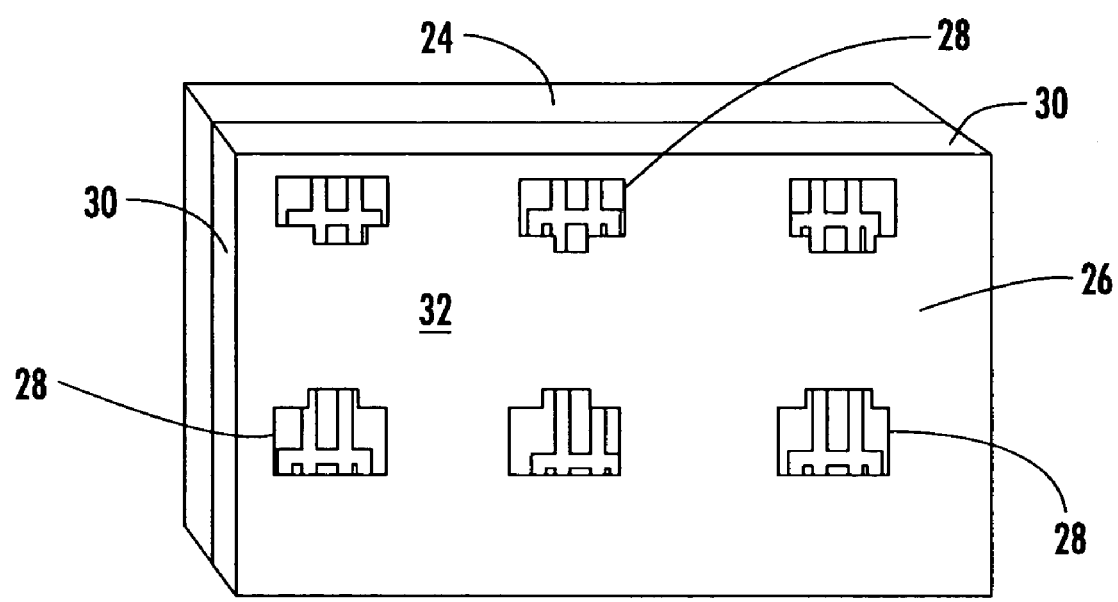
FIG. 3 is a perspective view of a metal sabot mask aligned over the common metal carrier.

FIG. 3 is a perspective view showing metal carrier 24 shown in FIG. 2, after a mask 26 has been placed over metal carrier 24. Mask 26 may be formed of metal or other suitably rigid and non-deformable materials. In an exemplary embodiment, mask or sabot 26 includes a plurality of openings 28 that correspond to the plurality of targeted portions which are desired to have a hermetic coating formed in a section thereof. In one exemplary embodiment, each of the sections to be coated, may be identical and according to other exemplary embodiments, they may be distinguished. According to either exemplary embodiment, the corresponding plurality of openings 28 formed in mask 26 may be identically shaped or differently shaped. In one exemplary embodiment, there may be a 1:1 correspondence between openings 28 and the OSAs disposed on the metal carrier 24. In another exemplary embodiment, multiple openings 28 may be aligned over a single OSA so that multiple local hermetic coatings may be formed on a single OSA. Mask 26 may contact or be attached to metal carrier 24. In an exemplary embodiment, mask 26 may include a flange or lip 30 that extends to contact the metal carrier 24. The contacting portions of mask 26 and metal carrier 24 may include corresponding relief features that mate with each other to aid in alignment in an exemplary embodiment, portions of mask 26 contact metal carrier 24 while the peripheral borders of openings 28 are spaced from the surfaces of targeted portions 12 over which they are aligned. In an exemplary embodiment, surface 32 is a planar surface and each of openings 28 are at the same height relative to metal carrier 24. It is contemplated that surface 32 of mask 26 may be non-planar in other exemplary embodiments and that therefore openings 28 may be disposed at different heights.

Figure 4:
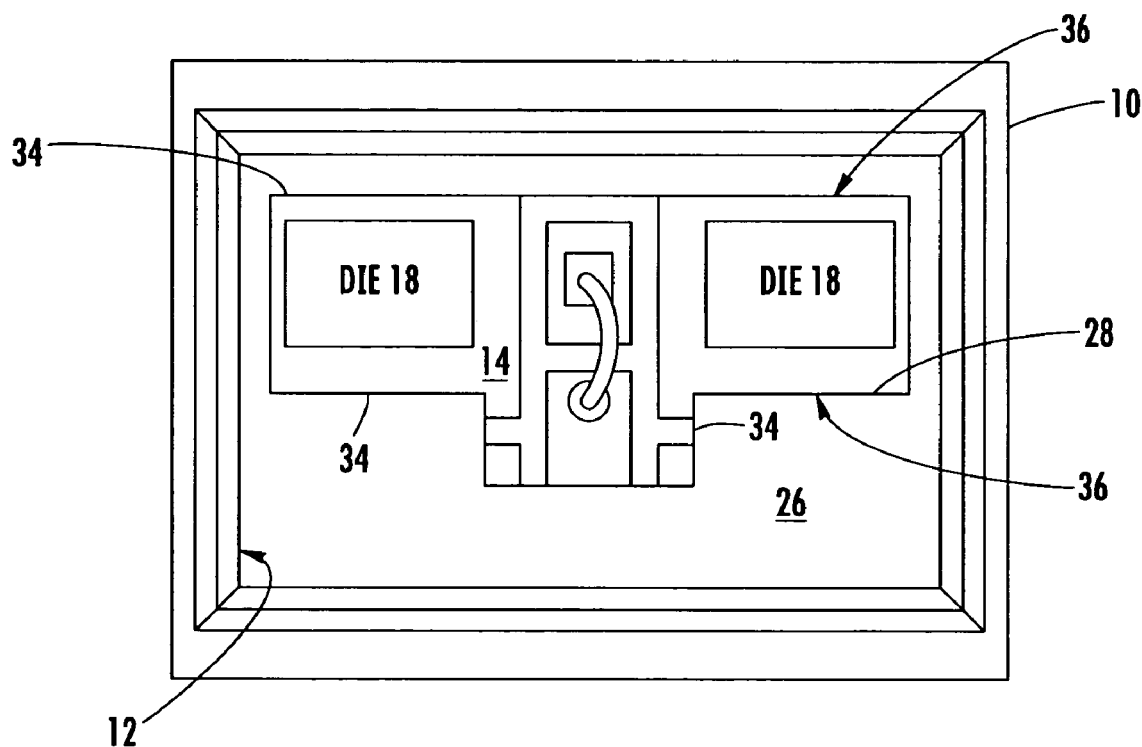
FIG. 4 is a plan view of an opening of a metal sabot mask aligned over a cavity of an exemplary ceramic carrier that includes optoelectronic components.

FIG. 4 shows an individual portion 12 including a portion of mask 26, including opening 28, aligned thereabove. Conventional automated machinery may be used to align openings 28 and bring mask 26 into position with respect to metal carrier 24 and portions 12. Peripheral edges 34 of opening 28 define section 36 of targeted portion 12 which is desired to be coated. Within section 36 are two die 18, electronic component 16, wire bond 20 and bond pad 22. In other exemplary embodiments, additional or alternative optoelectronic devices and/or additional die may be included in section 36 which will be coated. In yet another exemplary embodiment, portion 12 may have multiple discrete coatings formed thereon by the use of a corresponding multiplicity of openings 28.

Figure 5:
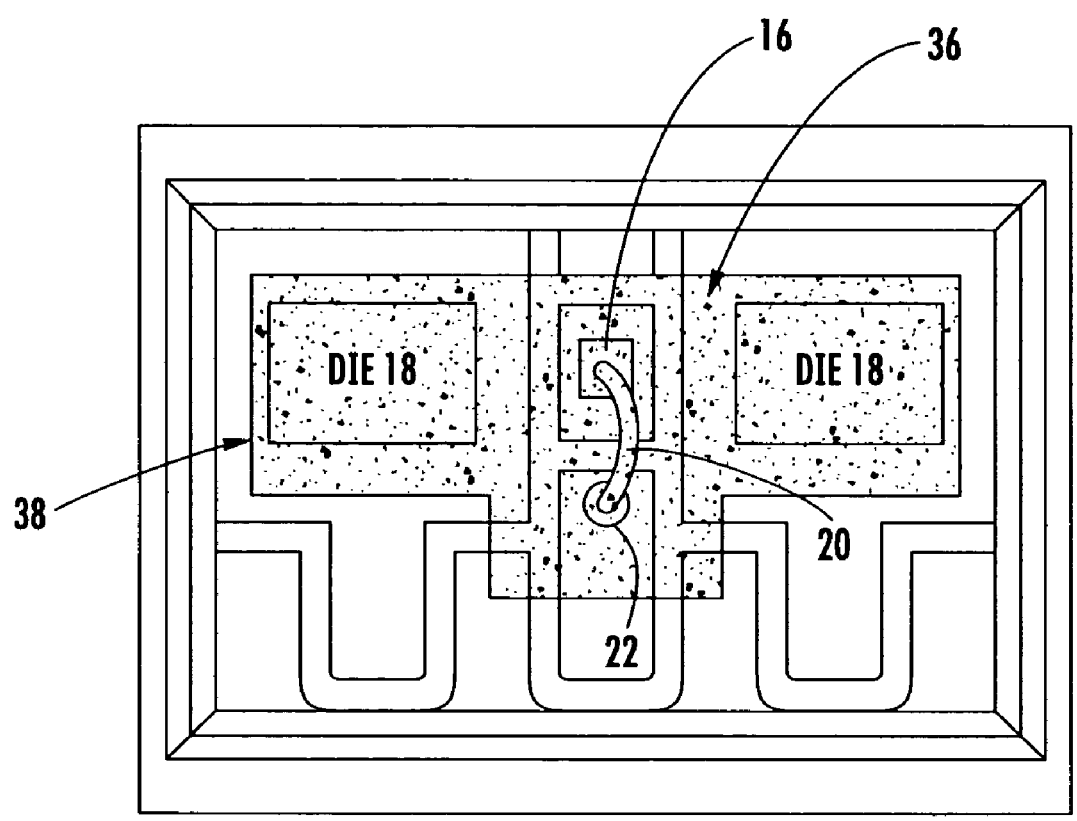
FIG. 5 shows a local hermetic coating applied over the optoelectronic components within the cavity of the exemplary ceramic carrier.

FIG. 5 shows the structure of FIG. 4 after a coating has been applied byway of deposition through opening 28 of mask 26, and mask 26 has been removed. Coating 38 is formed over section 36 of targeted portion 12 and covers portions of surfaces 14, die 18, optoelectronic component 16, wire bond 20, and bond pad 22. Coating 38 may take on various exemplary shapes corresponding to various configurations of openings 28 formed in mask 26. Coating 38 is a discrete portion of a single, continuous and conformal film that directly covers the exposed surfaces and components formed on the surfaces only in coated section 36 of portion 12. Coating 38 may be formed of paralene or other suitable encapsulating dielectrics and essentially hermetically seals the region over which it is formed. Additive reliability protection may be provided when components such as die 18 are individually hermetically sealed prior to the formation of coating 38. Coating 38 therefore provides a local hermetic sealing to a pre-selected, and designated region—section 36. Coating 38 may be formed of various suitable hermetic materials which may be introduced by deposition, sputtering, or other suitable means.

In an exemplary embodiment, coating 38 may be formed of a paralene material. In one exemplary embodiment, the paralene may be a continuous film of linear poly(p-xylene). Other forms of paraxylenes which are dimer monomers may be used and deposited using suitable deposition techniques such as CVD, chemical vapor deposition. A characteristic of paraxylene is that it coats advantageously evenly on all surfaces. Paraxylene is sold under the trade name Paralene, previously available from Union Carbide. Paralenes are advantageously waterproof sealants. Paralene coatings include a water absorption of <0.1% ASTM D570. Paralenes are further characterized by a desirably low water vapor transmission and moisture vapor transmission even in high relative humidity environments. Commercially available "Parylene C" forms membranes that have been shown to be pinhole free at least down to thicknesses of 300 angstroms. Paralenes are desirably hydrophobic and form a significant barrier to the penetration of ionic or moisture species. In an exemplary embodiment, paralenes may be mechanically stable through the temperature range of −200° C. and 150° C. They include low out-gassing characteristics, excellent adhesion properties, and CTE's (coefficients of thermal expansion) that are highly compatible with plastic encapsulant materials.

Coating 38 may be formed of various paralenes or other suitable dielectric materials having the hermeticity characteristics as described in conjunction with paralenes. Various suitable coating systems may be used to form the-coating. Coating 38 may be formed to various suitable thicknesses. In an exemplary embodiment, the thickness may range from 2 microns to 25 microns. The paralene or other suitable hydrophobic protective coating 38 may be chosen to be transmissive to the wavelength of light of the optical sub-assembly, for example the wavelength of light emitted by a VCSEL encapsulated as described above, or the targeted wavelength of light to be detected by an encapsulated photodetector.

Figure 6:
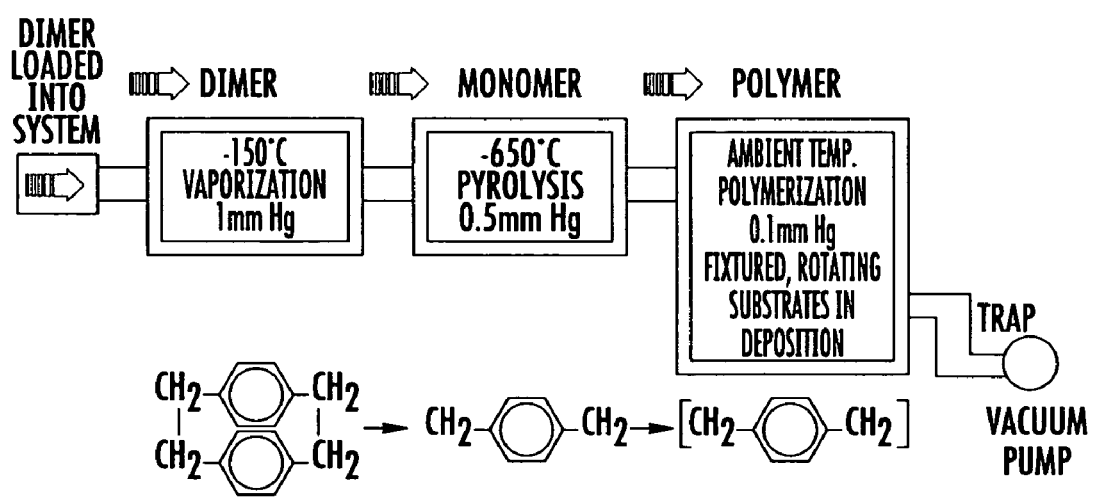
FIG. 6 shows and describes the exemplary method for applying a paralene coating.

FIG. 6 illustrates one exemplary method for forming a continuous film of linear poly(p-xylene) paralene material. As indicated in FIG. 6, a three-stage process sequence is used in which a crystalline paralene solid dimer, di-p-xylene, is sublimed under vacuum at 175° C. and then pyrolized at 680° C. to produce a reactive intertmediate monomer p-xylene. An ambient temperature polymerization process follows and film deposition upon the substrate generally takes place at room temperature. The monomer spontaneously polymerizes on surface in the vacuum chamber to produce a continuous film of linear poly(p-xylene). The mean free path of the molecule vapor, less than 1 mm, assures a slow forming uniform coating. An annealing step can be added to promote hardness of the coating. This method of application which advantageously takes place in a standard coating machine, is intended to be exemplary only and other paralenes and thermoplastic film polymers based on p-xylene and made by vaporphase polymerization, may be used according to other exemplary embodiments.

The method of the present invention includes providing an OSA having at least one exposed optoelectronic component, and a paralene source. The exposed optoelectronic component(s) may be formed on a surface and may include integrated circuit die, other semiconductor die, VCSELs and/or photodetectors. The surface may be formed in a cavity formed in a ceramic carrier or other OSA. Mask 26 is placed between the region or regions which are desired to be hermetically coated, and the paralene source, then the paralene source is caused to generate paralene such that a paralene coating is deposited through the opening or openings in the mask and onto the corresponding region or regions of the OSA to which the mask opening or openings are aligned, essentially hermetically sealing each region. The paralene coating is a permanent coating. Various suitable paralenes and paralene generation processes may be used, as above.

In one embodiment, a plurality of OSAs may be mounted or otherwise joined to a metal carrier or other common assembly, and a plurality of mask openings may be used to provide for the simultaneous formation of a corresponding plurality of permanent coatings formed on targeted regions of the OSAs.

Mask 26 may be reusable. After the deposition process is used to form at least one local hermetic coating, the mask is removed and various conventional film removal techniques such as etching or chemical cleaning may be used to remove the paralene formed on the mask prior to reusing the mask. The mask need not be cleaned prior to each use; according to other exemplary embodiments, the mask 26 may be used multiple times prior to cleaning.

The illustrated and described exemplary embodiments are intended to be illustrated and not restrictive of the present invention.

What is claimed is:

1. A method for the local hermetic sealing of an OSA (optical sub-assembly), comprising:
   providing an OSA having at least one exposed optoelectronic component;
   providing a paralene source;
   positioning a mask between said paralene source and said OSA, said mask including an opening aligned with a first region of said OSA, said first region including at least one of said at least one exposed optoelectronic components; and
   causing said paralene source to generate paralene such that a permanent paralene coating is deposited on said first region of said OSA through said opening, said permanent paralene coating essentially hermetically sealing said first region.

2. The method as in claim 1, in which said providing an OSA includes providing a ceramic carrier having a cavity extending from a surface thereof and said first region is disposed within said cavity.

3. The method as in claim 1, in which said at least one exposed optoelectronic component includes at least one of a VCSEL (vertical cavity surface emitting laser), a photodetector and an integrated circuit die.

4. The method as in claim 1, in which said mask is formed of one of metal and a further rigid material, and is re-usable.

5. The method as in claim 1, wherein said step of causing comprises forming a continuous and conformal film, said paralene coating hermetically sealing said first region and not extending outside of said first region.

6. The method as in claim 1, in which said causing comprises depositing poly(p-xylene) as said paralene.

7. The method as in claim 1, in which said causing includes vaporization of a crystalline paralene solid dimer, followed by pyrolosis.

8. The method as in claim 1, in which said causing includes depositing said paralene coating at room temperature.

9. The method as in claim 1, in which said at least one optoetectronic components includes a VCSEL and said paralene coating is transmissive to light emitted by said VCSEL.

10. The method as in claim 1, in which portions of said mask that border said opening, are spaced from said OSA during said causing.

11. A method for the local hermetic sealing of optical sub-assemblies (OSAs), comprising: providing a paralene source; providing a plurality of optical sub-assemblies on a common carrier, each optical sub-assembly having exposed optoelectronic components disposed within a first region;
   positioning a mask between said paralene source and said plurality of optical sub-assemblies, said mask including a corresponding plurality of openings, each opening aligned with a corresponding first region of a corresponding optical sub-assembly; and
   causing said paralene source to generate paralene such that a permanent paralene coating is deposited on each said first region through said corresponding opening, each said permanent paralene coating essentially hermetically sealing said corresponding first region.

12. The method as in claim 11, in which said common carrier is formed of metal and said plurality of optical sub-assemblies are arranged in an array and joined to said common carrier, and said positioning includes said mask contacting said common carrier.

* * * * *